(12) United States Patent
Koo

(10) Patent No.: US 9,251,901 B2
(45) Date of Patent: Feb. 2, 2016

(54) SEMICONDUCTOR MEMORY DEVICE WITH HIGH THRESHOLD VOLTAGE DISTRIBUTION RELIABILITY METHOD

(71) Applicant: SK hynix Inc., Icheon-si, Gyeonggi-do (KR)

(72) Inventor: Cheul Hee Koo, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 157 days.

(21) Appl. No.: 13/846,855

(22) Filed: Mar. 18, 2013

(65) Prior Publication Data

US 2014/0169096 A1    Jun. 19, 2014

(30) Foreign Application Priority Data

Dec. 18, 2012    (KR) .......................... 10-2012-0148379

(51) Int. Cl.
*G11C 16/10* (2006.01)
*G11C 16/24* (2006.01)

(52) U.S. Cl.
CPC ................ *G11C 16/10* (2013.01); *G11C 16/24* (2013.01)

(58) Field of Classification Search
CPC .... G11C 16/0483; G11C 16/10; G11C 16/16; G11C 16/3418; H01L 27/115

USPC ............ 365/185.17, 185.24, 185.33, 185.02, 365/185.05; 326/6, 51, 104; 711/103
See application file for complete search history.

(56) References Cited

U.S. PATENT DOCUMENTS

| | | | |
|---|---|---|---|
| 7,486,554 B2 * | 2/2009 | Park et al. ................. | 365/185.02 |
| 8,670,273 B2 * | 3/2014 | Aritome et al. .......... | 365/185.03 |
| 2008/0043528 A1 * | 2/2008 | Isobe et al. ............... | 365/185.03 |
| 2008/0273388 A1 * | 11/2008 | Chin et al. ................ | 365/185.17 |
| 2009/0250745 A1 * | 10/2009 | Kim ............................. | 257/324 |
| 2010/0046290 A1 * | 2/2010 | Park et al. .................. | 365/185.2 |
| 2013/0070529 A1 * | 3/2013 | Park ........................ | 365/185.11 |

FOREIGN PATENT DOCUMENTS

KR    1020130139598 A    12/2013

* cited by examiner

*Primary Examiner* — Alexander Sofocleous
*Assistant Examiner* — Alfredo Bermudez Lozada
(74) *Attorney, Agent, or Firm* — William Park & Associates Ltd.

(57) ABSTRACT

A semiconductor memory device includes: a memory array including a plurality of memory cells; and a peripheral circuit configured to change a voltage level of a bit line connected to a program target cell according to a threshold voltage of the program target cell among the memory cells during a program operation.

10 Claims, 7 Drawing Sheets

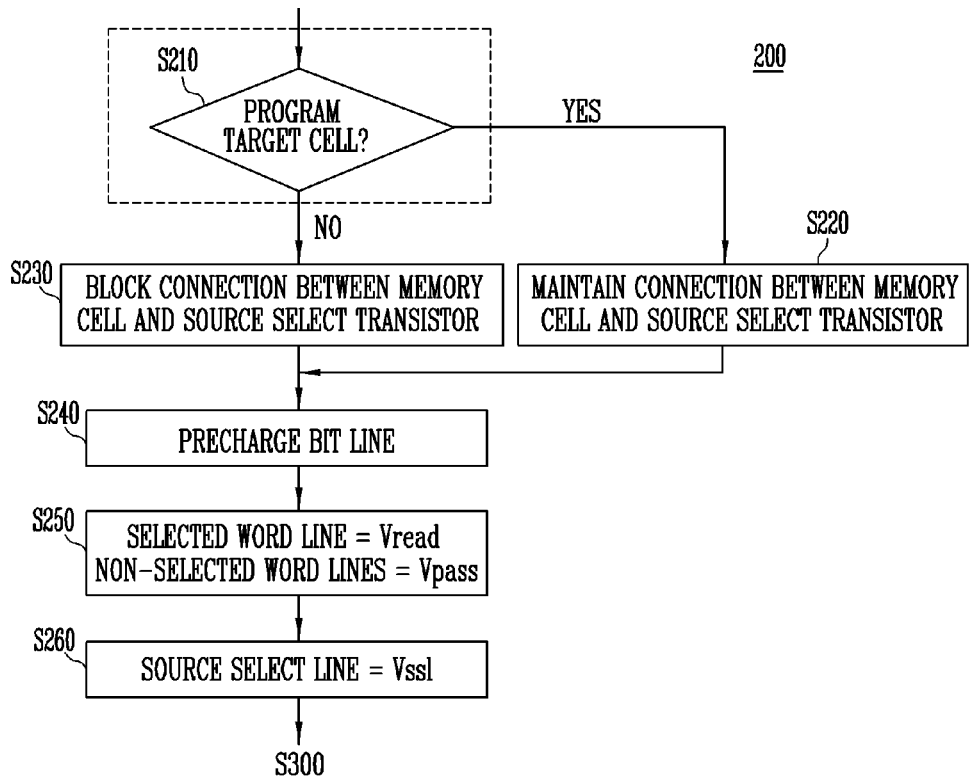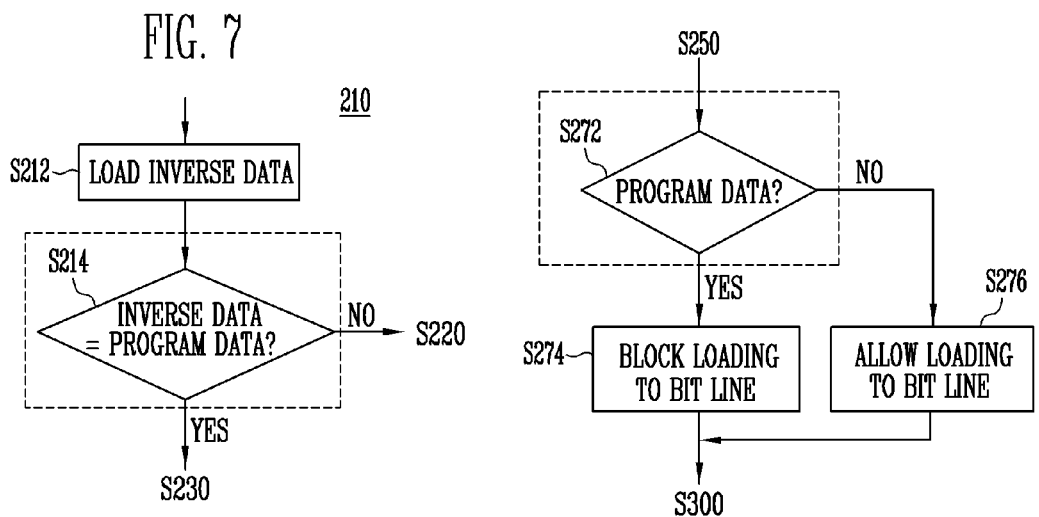

SEMICONDUCTOR MEMORY DEVICE WITH HIGH THRESHOLD VOLTAGE DISTRIBUTION RELIABILITY METHOD

CROSS-REFERENCE TO RELATED APPLICATION

This application is based on and claims priority from Korean Patent Application No. 10-2012-0148379, filed on Dec. 18, 2012, with the Korean Intellectual Property Office, the disclosure of which is incorporated herein in its entirety by reference.

BACKGROUND

The present invention generally relates to a semiconductor memory device and an operation method thereof, and more particularly, to a semiconductor memory device capable of improving threshold voltage distribution, and a method of operating the same.

A semiconductor memory device may be generally divided into a volatile memory device and a non-volatile memory device.

The volatile memory device has a high write and read rate, but when power supply is interrupted, stored data may be lost. The non-volatile memory device has a relatively lower write and read rate than the volatile memory device, but even though power supply is interrupted, stored data is maintained. Accordingly, the non-volatile memory device for storing data, which needs to be maintained regardless of whether power is supplied, is used. The non-volatile memory device includes a Read-Only Memory (ROM), a Mask ROM (MROM), a Programmable ROM (PROM), an Erasable Programmable ROM (EPROM), an Electrically Erasable Programmable ROM (EEPROM), a flash memory, a Phase-change Random Access Memory (PCRAM), a Magnetic RAM (MRAM), a Resistive RAM (ReRAM), a Ferroelectric RAM (FRAM), and the like. The flash memory among of the non-volatile memory device may be divided into a NOR type and a NAND type.

Especially, the flash memory has an advantage of the RAM in which program and erase of data are free, and an advantages of the ROM in which even though power supply is interrupted, stored data may be preserved. The flash memory is widely used as a storing media of a portable electronic device, such as a digital camera, a personal digital assistant (PDA), and an MP3 player.

However, a range of threshold voltage distribution of memory cells of the flash memory is increased due to various factors. It is necessary to improve reliability of the semiconductor memory device by improving threshold voltage distribution of the memory cells of the flash memory.

SUMMARY

An embodiment of the present invention provides a semiconductor memory device, including: a memory array including a plurality of memory cells; and a peripheral circuit configured to change a voltage level of a bit line connected to a program target cell according to a threshold voltage of the program target cell among the memory cells during a program operation.

The memory array includes a plurality of strings, and each string includes a source select transistor, first to $n^{th}$ memory cells, a drain select transistor serially connected between a source line and a bit line, and a string connection circuit connected between the first memory cell and the source select transistor, and the string connection circuit maintains a connection between the first memory cell and the source select transistor when the string includes the program target cell, and blocks the connection between the first memory cell and the source select transistor when the string includes a program inhibition cell, in response to a string control signal during the program operation.

An embodiment of the present invention provides a method of operating a semiconductor memory device, including; changing a voltage level of a bit line connected to a program target cell according to a threshold voltage of the program target cell among memory cells connected to a selected word line on which a program operation is to be performed; and applying a program voltage to the selected word line.

The changing of the voltage level of the bit line connected with the program target cell includes: maintaining a connection between memory cells and a source select transistor of a string including the program target cell, and blocking a connection between memory cells and a source select transistor in a string including a program inhibition cell; precharging bit lines connected to the strings; applying a read voltage to a selected word line and applying a pass voltage to non-selected word lines in order to precharge channels of the strings; and connecting the memory cells and a source line in order to discharge a channel of a string including the program target cell among the strings.

According to the embodiment of the present invention, the bit line voltage of the memory cell is changed according to the threshold voltage of the memory cell during the program operation, so that it is possible to improve threshold voltage distribution of the memory cells and reduce operation current.

According to the embodiment of the present invention, the threshold voltage distribution is improved, so that it is possible to improve a program range by increasing a size of an ISPP step voltage during the program operation. In this case, the number of program pulses applied to the memory cell is decreased, so that stress applied to the memory cell may be decreased. Accordingly, it is possible to improve reliability of the memory cell.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIGS. 5 to 8 are flowcharts for describing a method of operating a semiconductor memory device according to an embodiment of the present invention;

DETAILED DESCRIPTION

Figure 1:
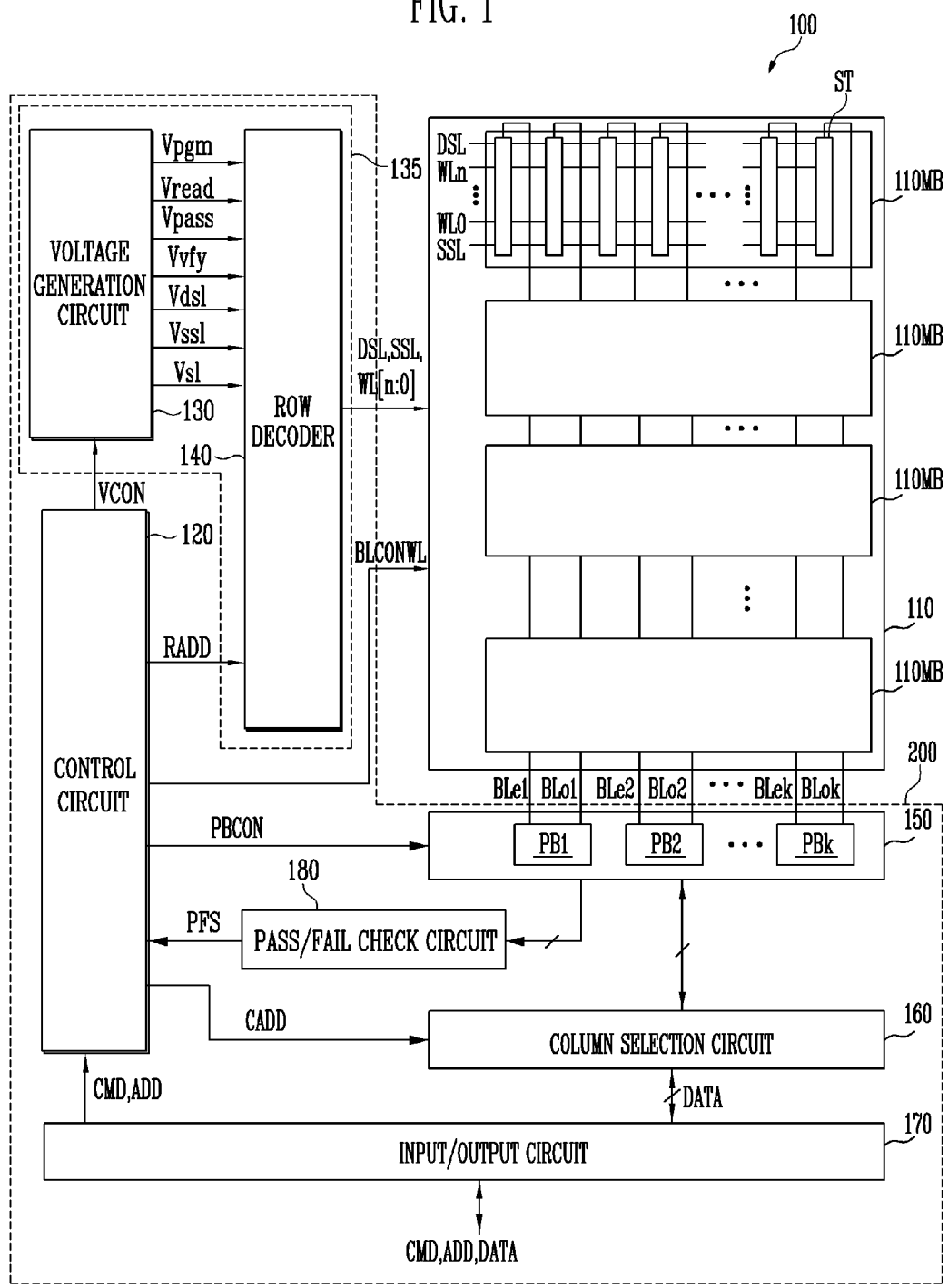
FIG. 1 is a block diagram for describing a semiconductor memory device according to an embodiment of the present invention.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

The semiconductor memory device 100 may include a memory array 110, a control circuit 120, and peripheral circuit 200.

The memory array 110 may include a plurality of memory blocks 110MB.

The peripheral circuit 200 is configured to perform a program operation and a read operation of memory cells included in a selected page of the memory block 110MB. Further, the peripheral circuit 200 is configured to change a voltage level of a bit line connected to a program target cell according to a threshold voltage of the program target cell among the memory cells during a program operation. That is, the periphereal circuit 200 may have a function for operating the semiconductor memory device 100.

The control circuit 120 is configured to control the peripheral circuit 200. In a case, the memory array 110 may include a NAND flash memory structure, the peripheral circuit 200 may be configured to include a voltage supply circuit 135, a page buffer group 150, a column selection circuit 160, an input/output circuit 170, and a pass/fail check circuit 180.

Figure 2:
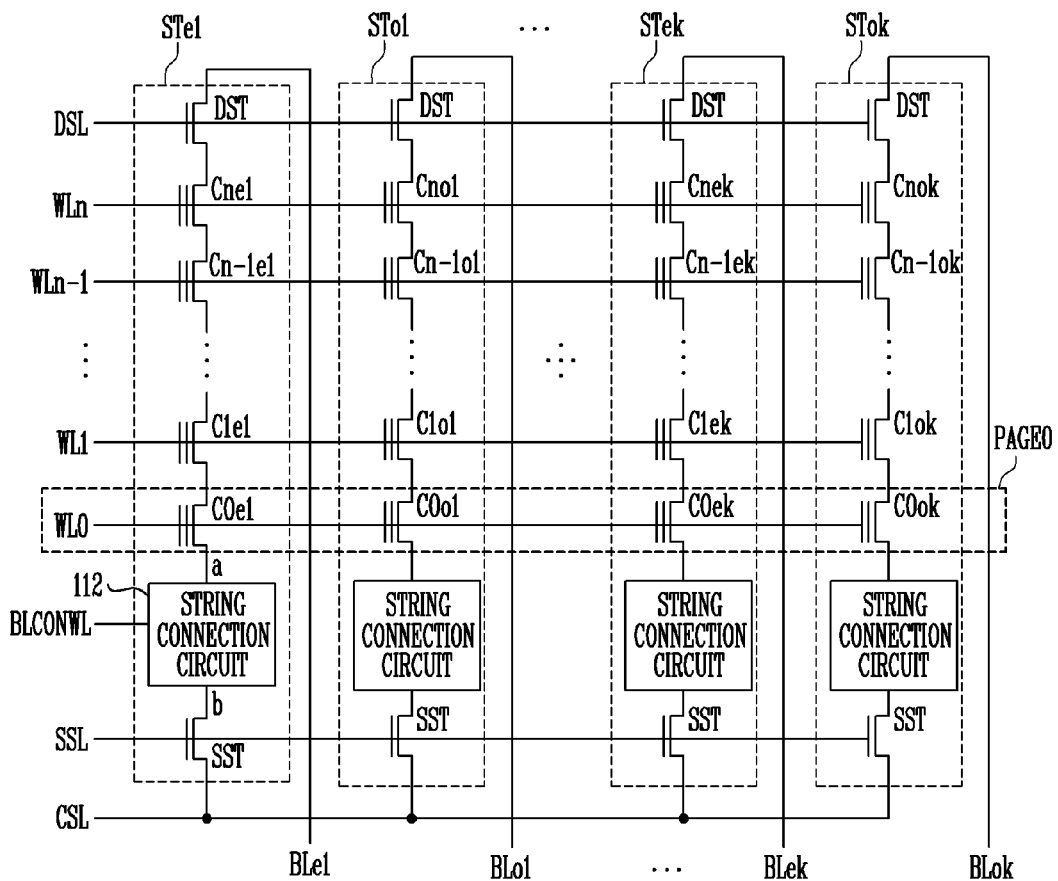
FIG. 2 is a circuit diagram for describing a memory block illustrated in FIG. 1.

Referring to FIG. 2, each memory block 110 MB may include a plurality of strings STe1 to STek, and STo1 to STok connected between bit lines BLe1 to BLek, and BLo1 to BLok, and a common source line CSL. That is, the strings STe1 to STok may be connected to the corresponding bit lines BLe1 to BLok, respectively, and may be connected to the common source line CSL in common.

Each string STe1 may include a source select transistor SST, a string connection circuit 112, and a plurality of memory cells C0e1 to Cne1, and a drain select transistor DST The source select transistor SST may include a gate connected to a source select line SSL, a source connected to the common source line CSL and a drain connected to the string connection circuit 112.

The memory cells C0e1 to Cne1 may be serially connected between the string connection circuit 112 and the drain select transistor DST. Gates of the memory cells C0e1 to Cne1 may be connected to word lines WL0 to WLn, respectively.

The string connection circuit 112 may be connected between the memory cell C0e1 and the source select transistor SST. The string connection circuit 112 may be operated in response to a string control signal BLCONWL. For example, an electric path between the memory cell C0e1 and the source select transistor SST may be formed according to an operation of the string connection circuit 112. In more detail, the string connection circuit 112 may be configured to maintain a connection between the memory cell C0e1 and the source select transistor SST when the string STe1 includes a program target cell, and block the connection between the memory cell C0e1 and the source select transistor SST when the string STe1 includes a program inhibition cell, in response to the string control signal BLCONWL during the program operation. That is, the string connection circuit 112 may be configured to control the connection between the memory cell C0e1 and the source select transistor SST according to the string control signal BLCONWL and inversed data for program a selected memory cell.

The drain select transistor DST may include a gate connected to a drain select line DSL, a source connected to memory cell Cne1 and a drain connected to a corresponding bit line BLe1.

In the NAND flash memory device, the memory cells included in the memory block may be divided in the unit of a physical page or a logical page. For example, memory cells C0e1 to C0ek, and C0o1 to C0ok connected to one word line (for example, the word line WL0) may configure one physical page PAGE0. Otherwise, even numbered memory cells C0e1 to C0ek connected to even numbered memory cells may configure one even physical page, and odd numbered memory cells C0o1 to C0ok configure one odd physical page. The page (or the even page and the odd page) is a basic unit of the program operation or the read operation.

The control circuit 120 may be configured to output a voltage control signal VCON for generating a voltage necessary for performing the program operation, a verification operation, or the read operation in response to a command signal CMD input through the input/output circuit 170 from an external device, and output PB control signals PBCON for controlling page buffers PB1 to PBk included in the page buffer group 150 according to an operation mode.

Especially, the control circuit 120 may output the string control signal BLCONWL for controlling the string connection circuit 112.

Further, the control circuit 120 may output a row address signal RADD and a column address signal CADD in response to an address signal ADD provided from the input/output circuit 170.

The voltage supply circuit 135 may supply operation voltages (for example, voltages Vpgm, Vread, Vpass, Vvfy, Vdsl, Vssl, and Vcsl) necessary for the program operation and the read operation of the memory cells to local lines including a drain select line DSL, the word lines WL0 to WLn, and the source select line SSL of the selected memory block in response to a voltage control signal VCON provided from the control circuit 120. The voltage supply circuit 135 may be configured to apply a pass voltage Vpass to word lines in order to transmit the inverse data to the string connection circuit 112, apply a read voltage Vread to a selected line among the word lines and apply the pass voltage Vpass to non-selected word lines, and apply a source select voltage Vssl to source select line SSL in order to discharge a channel of the string including the program target cell among the strings. The voltage supply circuit 135 may include a voltage generation circuit 130 and a row decoder 140.

The voltage generation circuit 130 may be configured to output the operation voltages (for example, the voltages Vpgm, Vread, Vpass, Vvfy, Vdsl, Vssl, and Vcsl) necessary for the program operation, the read operation, or the erase operation of the memory cells to global lines in response to the voltage control signal VCON of the control circuit 120. For example, for the program operation, the voltage generation circuit 130 may output the program voltage Vpgm to be applied to the memory cells of the selected page, and the pass voltage Vpass to be applied to the non-selected memory cells to the global lines. For the read operation, the voltage generation circuit 130 may output the read voltage Vread to be applied to the memory cells of the selected page and the pass voltage Vpass to be applied to the non-selected memory cells to the global lines.

The row decoder 140 may be configured to connect the global lines and the local lines DSL, WL0 to WLn, and SSL so that the operation voltages loaded at to the global lines may be transmitted to the local lines DSL, WL0 to WLn, and SSL of the memory block 110MB selected in the memory array 110 in response to the row address signals RADD of the control circuit 120. Accordingly, the program voltage Vpgm or the read voltage Vread may be applied to the local word line (for example, the word line WL0) connected with the selected cell (for example, the cell C0W through the global word line, for example, a selected global word line. Further, the pass voltage Vpass may be applied to the local word lines (for example, the word lines WL1 to WLn) connected with the non-selected cells C1e1 to Cne1 through the global word lines, for example, non-selected global word lines. Accordingly, the data may be stored in the selected cell C0e1 by the program voltage Vpgm, or the data is stored in the selected cell C0e1 may be read by the read voltage Vread.

Each of the page buffer groups 150 may include a plurality of page buffers includes PB1 to PBk connected with the memory array 110 through the bit lines BLe1 to BLek, and BLo1 to Blok. The page buffers PB1 to PBk of the page buffer group 150 may selectively precharge the bit lines BLe1 to BLek or BLo1 to Blok according to the data, which is input to be stored the data in the memory cells C0e1 to C0ek or C0o1 to C0ok, in response to the PB control signal PBCON of the control circuit 120. Further, the page buffers PB1 to PBK may sense the voltages of the bit lines BLe1 to BLek or BLo1 to Blok in order to read the data from the memory cells C0e1 to C0ek or C0o1 to C0ok.

The column selection circuit 160 may select the page buffers PB1 to PBk included in the page buffer group 150 in response to the column address signal CADD provided from the control circuit 120. That is, the column selection circuit 160 may sequentially transmit the data to be stored in the memory cells to the page buffer PB1 to PBk in response to the column address signal CADD. Further, the column selection circuit 160 may sequentially select the page buffers PB1 to PBk in response to the column address signal CADD so that the data of the memory cells latched in the page buffers PB1 may be output to the external device by the read operation.

The input/output circuit 170 may transmit the data to the column selection circuit 160 based on the control of the control circuit 120 in order to provide the data to the page buffer group 150 during the program operation. The data may be provided from the external device, and will be stored in the memory cell. When the column selection circuit 160 may transmit the data transmitted from the input/output circuit 170 to the page buffers PB1 to PBk of the page buffer group 150. The page buffers PB1 to PBk may temporarily store the data in internal latch circuits included in the page buffers PB1 to PBk. Further, the input/output circuit 170 may output the data transmitted from the page buffers PB1 to PBk of the page buffer group 150 through the column selection circuit 160 during the read operation.

The pass/fail check circuit 180 may generate the pass/fail signal PFS in response to comparison result signals provided from the page buffers PB1 to PBk during the program verification operation performed after the program operation. Particularly, the page buffers PB1 to PBk may perform a comparison operation for comparing the threshold voltage of the memory cell which was programmed with a target voltage when the program verification operation. Comparison results are latched in the page buffers PB1 to PBk, the page buffers PB1 to PBk may output the latched comparison results to the pass/fail check circuit 180. The pass/fail check circuit 180 may output the pass/fail signal PFS indicating whether the program operation is completed to the control circuit 120 in response to the comparison result signals. The control circuit 120 may determine whether the memory cell having the threshold voltage lower than the target voltage is present in the memory cells in which the program data is stored in response to the pass/fail signal PFS, and determine whether to re-perform the program operation according to a result of the determination.

Figure 3:
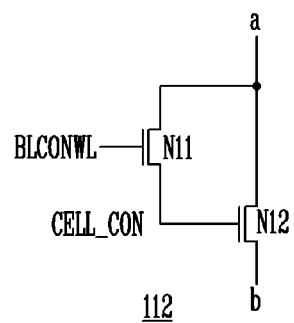
FIG. 3 is a circuit diagram for describing a string connection circuit illustrated in FIG. 2.

Referring to FIG. 3, the string connection circuit 112 may include a first switching element N11 and a second switching element N12. The first switching element N11 may be configured to connect a node 'a' and a cell control node CELL_CON in response to the string control signal BLCONWL. Inverse data of the data stored in the internal latch unit of the page buffer PB1 to PBk may be transmitted to the node 'a' through the bit line when the drain select transistor is turned on and the pass voltage is applied to all the word lines. Therefore, the first switching element N11 may be configured to transmit the inverse data from the node 'a' to the cell control node CELL_CON in response to the string control signal BLCONWL.

The second switching element N12 is configured to connect the node 'a' and a node 'b' in response to a voltage level of the cell control node CELL_CON. Therefore, the second switching element N12 is configured to connect a first memory cell (for example, C0e1 or C0o1) adjacent to the source select transistor SST and the source select transistor SST in response to the transmitted inverse data.

When the inverse data may be the program inhibition data (for example, 1), the corresponding memory cell may be the program target cell. In this case, the first switching element N11 is turned on in response to the string control signal BLCONWL, so that the cell control node CELL_CON (that is, a drain voltage of the first switching element N11) may come to have a high level. The second switching element N12 may be turned according to a potential of the cell control node CELL_CON, so that the first memory cell may be connected with the source select transistor.

When the inverse data may be the program data (for example, 0), the corresponding memory cell is the program inhibition cell. In this case, the first switching element N11 may be turned on in response to the string control signal BLCONWL, so that the cell control node CELL_CON may come to have a low level. Thus, the second switching element N12 may be turned off according to the potential of the cell control node CELL_CON, so that the first memory cell may be disconnected from the source select transistor.

Figure 4:
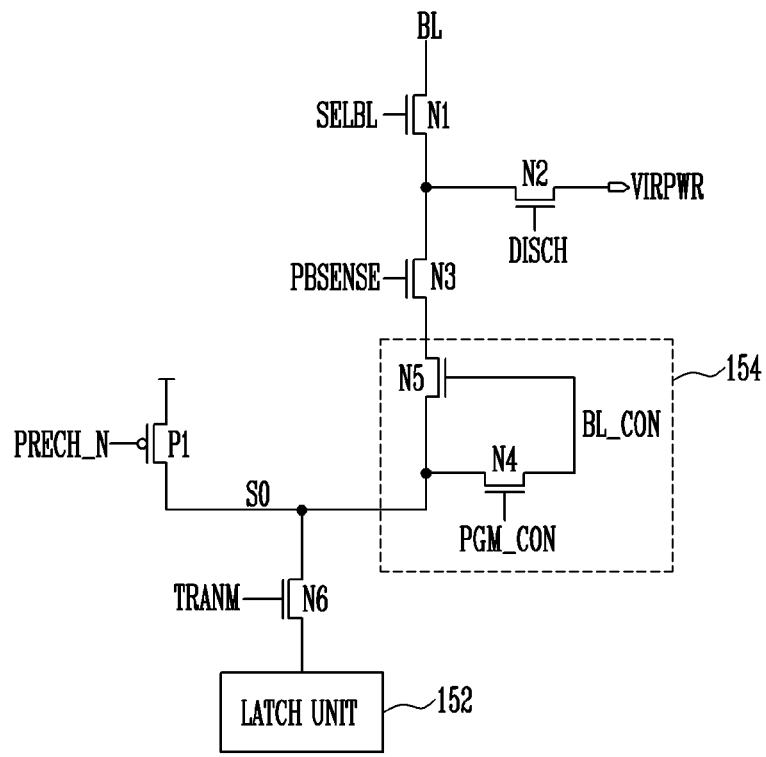
FIG. 4 is a circuit diagram for describing a page buffer illustrated in FIG. 1.

Referring to FIG. 4, the page buffer PB1 to PBk may be operated according to the control of the control circuit (see reference numeral 120 of FIG. 1), and signals PRECH_N, TRANM, PBSENSE, SELBL, DISCH, and PGM_CON to be described below may be output by the control circuit 120.

Each of the page buffer PB1 to PBk may include a plurality of switching elements N1, N2, N3, N6, and P1, a latch unit 152 and the bit line connection circuit 154. The switching element N1 may select the bit line BL in response to a bit line selection signal SELBL. The switching element N2 may perform an operation of precharging the bit line during the program operation in response to a discharge signal DISCH. The switching element N3 may perform an operation of connecting the bit line selected by the switching element N1 and the latch unit 152 in response to a sensing signal PBSENSE. The switching element N3 may be selectively connected with a sensing node SO connected with the latch unit 152.

A precharge circuit P1 may perform an operation of precharging the sensing node SO in response to a precharge signal PRECH_N. The latch unit 152 may include a plurality of switching elements and latch devices. The latch unit 152 may correspond to be the internal lath unit, as the above described. The latch unit 152 may be configured to temporarily store the data to be programmed in the memory cell and the inverse data.

The data transmitter N6 may transmit the data stored in the latch unit 152 to the sensing node SO in response to the data transmission signal TRANM.

The bit line connection circuit 154 may connect the sensing node SO and the switching element N3 in response to a bit line control signal PGM_CON.

The bit line connection circuit 154 may include a switching element N4 configured to transmit a potential of the sensing node SO in response to the bit line control signal PGM_CON, and a switching element N5 configured to connect the sensing node SO and the switching element N3 according to the transmitted potential of the sensing node SO.

When the potential of the sensing node SO may be a high level, the switching element N4 may be turned on in response to the bit line control signal PGM_CON, so that the bit line control node BL_CON may come to have a high level. The switching element N5 may be turned on according to the potential of the bit line control node BL_CON, so that the sensing node may be connected with the switching element N3.

When the potential of the sensing node SO may be the low level, the switching element N4 may be turned on in response to the bit line control signal PGM_CON, so that the bit line control node BL_CON may come to have a low level. The switching element N5 may be turn off according to the potential of the bit line control node BL_CON, so that the sensing node SO is disconnected with the switching element N3.

The bit line connection circuit 154 may control the connection of the sensing node SO and the bit line BL according to the data stored in the latch unit 152, so that it is possible to control the loading of the data to the bit line.

Hereinafter, a method of operating the semiconductor memory device having the aforementioned configuration will be described.

Figure 5:
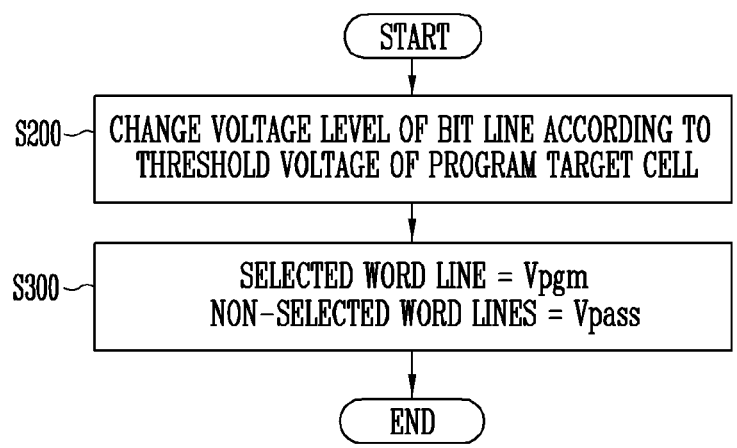

Referring to FIG. 5, the method of operating the semiconductor memory device may include a step for setting-up a bit line, and a step for applying a program voltage.

In the step for setting-up of the bit line, a voltage level of the bit line connected to a program target cell may be changed according to a threshold voltage of the program target cell among the memory cells connected to a selected word line on which the program operation is to be performed (S200).

In the step for applying of the program voltage, the program voltage Vpgm may be applied to the selected word line and the pass voltage Vpass may be applied to the non-selected word lines (S300).

Referring to FIG. 6, the step for setting-up of the bit line may include a step for connecting a string, a step for precharging the bit line and the channel, and a step for controlling a bit line voltage.

In the step for connecting of the string, the string including the program target cell may maintain a connection between the memory cells and the source selection transistor (S220), and the string including the program inhibition cell blocks the cell string and the source selection transistor (S230).

Next, the bit lines connected with the strings are precharged (S240).

Then, the read voltage Vread may be applied to the selected word line and the pass voltage Vpass may be applied to the non-selected word lines in order to precharge the channels of the strings.

Next, the memory cells and the source line CSL may be connected by applying the voltage (Vssl) to the source select line in order to discharge the channel of the string including the program target cell (S260). In this case, the voltage level of the bit line may be changed according to the threshold voltage of the program target cell. An amount of cell current flowing in the string may be different according to the threshold voltage of the program target cell. Since the memory cells and the source line are not connected, the channel of the string including the program inhibition cell is not discharged. The cell current does not flow in the string including the program inhibition cell. Accordingly, the bit line may be maintained in a precharge state without a change in the voltage level of the bit line.

In the program target cells, the amount of the cell current may be different according to the threshold voltages so that the voltage level of the bit line may be changed. Accordingly, the threshold voltages of the program target cells may be equally increased by the program operation. Since the cell current does not flow in the bit line, the program inhibition cells are maintained in the precharge state, so that the thresholds are not increased.

Referring to FIG. 7, in a step of identifying the program target cells (S210), inverse data obtained by inverting the data to be stored in the memory cells connected to the selected word line may be loaded to the bit line (S212).

When the inverse data is not program data 0, the method proceeds to step S220, and when the inverse data is the program data 0, the method proceeds to step S230 (S214).

Referring to FIG. 8, when the channel is discharged after the channel is precharged, it is identified (verified) whether the data stored in the page buffer is the program data (S272). When the data stored in the page buffer is the program data, the loading of the data to the bit line is blocked (S274), and when the data stored in the page buffer is the program inhibition data, the loading of the data to the bit line is allowed (S276).

Figure 9:
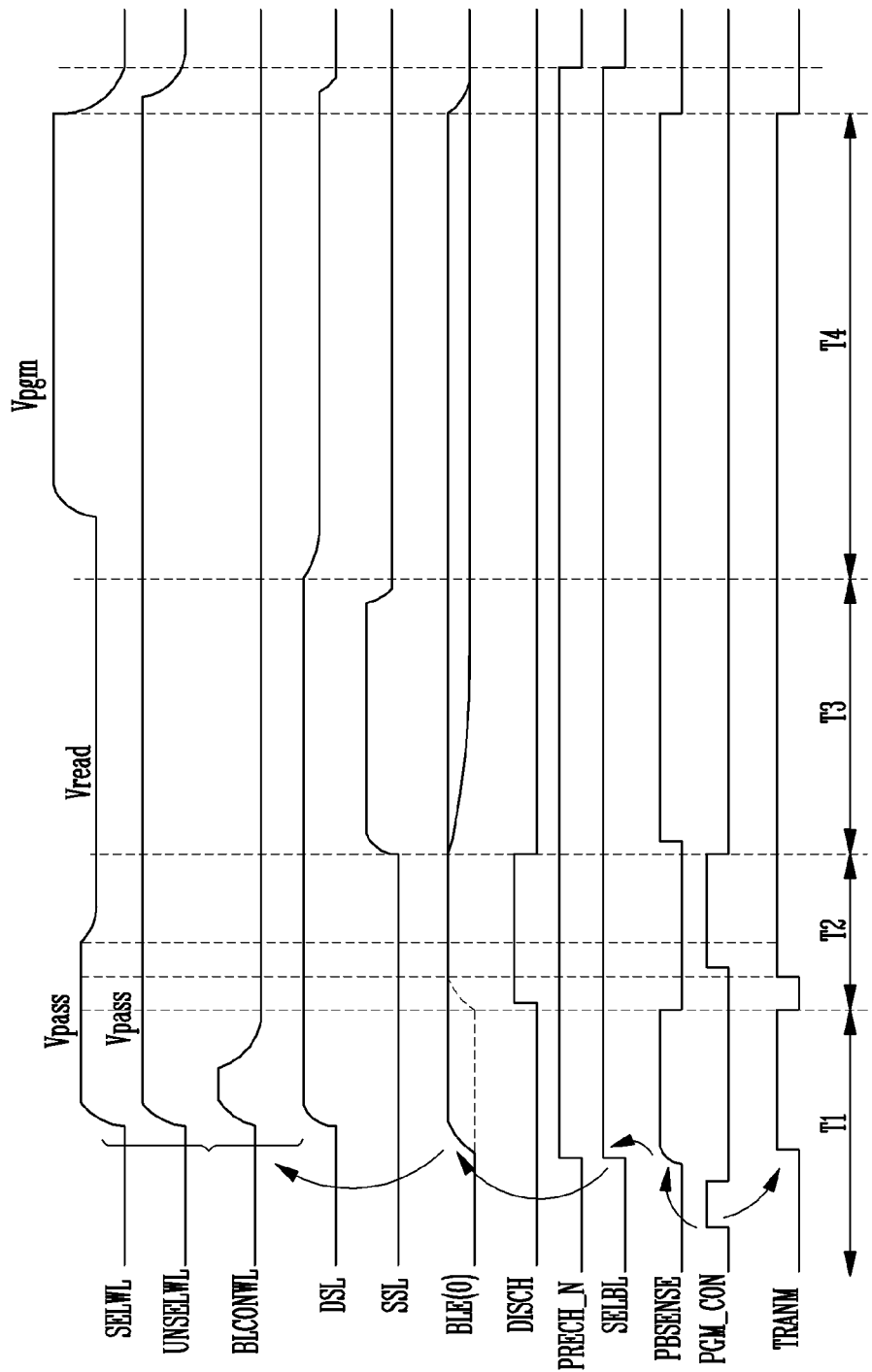
FIG. 9 is a timing diagram for describing a method of operating a semiconductor memory device according to an embodiment of the present invention.

Referring to FIG. 9, the method of operating the semiconductor memory device according to the embodiment of the present invention includes a string connection step T1, a precharge step T2, a bit line voltage control step T3, and a program step T4.

String Connection Step T1

The sensing node SO of the page buffer PB1 to PBk may be discharged in response to the precharge signal PRECH_N. The switching element N4 of the bit line connection circuit 154 may be turned on in response to the bit line control signal PGM_CON, so that the sensing node SO and the bit line control node BL_CON may be connected. The switching element N5 may be turned on according to a voltage level of the bit line control node BL_CON. Then, the switching elements N3 and N1 may be turned on in response to the sensing signal PBSENSE, so that the bit line BL and the sensing node SO may be connected.

The inverse data obtained by inverting the data stored in the latch unit 152 may be loaded to the bit line BL in response to the transmission signal TRANM. That is, when the program data includes the lowe level (for example, 0), the inverse data having the high level (for example, 1) is loaded to the bit line BL. When the program inhibition data includes an erase data with the high level (for example, 1, the inverse data of the program inhibition data includes the low level (for example, 0), and loaded to the bit line BL.

When a voltage may be applied to the drain select line DSL, and the pass voltage Vpass may be applied to the selected word line SELWL and the non-selected word lines UNSELWL, the channel may be formed. When the switching element N2 may be turned on in response to the string control signal BLCONWL, the source of the first memory cell adjacent to the source selection transistor and the cell control node CELL_CON may be connected.

When the string may include the program target cell, the cell control node CELL_CON may come to have a high level according to the inverse data of the program data. The switching element N1 may be turned on, so that the source of the first memory cell and the drain of the source selection transistor may be connected. Accordingly, in the string including the program target cell, the cell string may be connected with the source selection transistor. When the string may include the program inhibition cell, the cell control node CELL_CON may come to have a low level according to the inverse data of the program inhibition data. Since the switching element N1 may be turned off, the source of the first memory cell may be disconnected from the drain of the source selection transistor. Accordingly, in the string including the program inhibition cell, the cell string may be disconnected with the source selection transistor.

Precharge Stein T2

When the switching element N2 may be turned on in response to the discharge signal DISCH, all of the bit lines may be discharged by a virtual voltage VIRPWR. Since the switching element N3 may be in the turned-off state, the bit line BL may be disconnected from the sensing node SO.

When the voltage may be applied to the drain select line DSL, the read voltage Vread may be applied to the selected word line SELWL, and the pass voltage Vpass may be applied to the non-selected word lines UNSELWL, the channel may be formed. Contrary to the general program operation, the read voltage Vread, not the pass voltage Vpass, may be applied to the selected word line SELWL. The voltage level of the bit line may be changed according to the threshold voltage of the selected memory cell by adjusting a degree of the turning-on of the selected memory cell (or a driving ability of the selected memory cell).

In the meantime, the data of the latch unit 152 may be transmitted to the sensing node SO in response to the transmission signal TRANM, and in this case, the transmitted data may be obtained by re-inverting the inversed data in the string connection step T1. Accordingly, the original program data 0 and the program inhibition data 1 may be transmitted to the sensing node SO. The sensing node SO is connected with the bit line control node BL_CON in response to the bit line control signal PGM_CON. When the program data with the low level (for example, 0) may be transmitted to the sensing node SO, the switching element N5 may turned off, and when the program inhibition data with the high level (for example, 1) is transmitted to the sensing node SO, the switching element N5 is turned on.

Bit Line Voltage Control Step T3

When the voltage may be applied to the source select line SSL, the string may be connected with the source line CSL. The string including the program target cell may be connected with the source line, so that the bit line may be discharged. The string including the program inhibition cell may be disconnected from the source line, so that the bit line may be not discharged, and is maintained in the precharge state.

In the string including the program target cell, the voltage level of the bit line may be changed according to the threshold voltage of the program target cell. As the string may include the program target cell having a relatively high threshold voltage, a discharging rate of the bit line decreases, so that the string has a bit line voltage level higher than other strings. Contrary to this, as the string includes the program target cell having a relatively low threshold voltage, the discharging rate of the increase, so that the string has a bit line voltage level lower than other strings.

In the meantime, the bit line may be connected with the bit line connection circuit 154 (refer to FIG. 4) in response to the sensing signal PBSENSE. The bit line of the program target cell may be disconnected from the sensing node, and the bit line of the program inhibition cell may be connected with the sensing node SO. Accordingly, the bit line of the program inhibition cell may be maintained in the precharge state, and it is possible to prevent the voltage level from being decreased due to leakage current.

Program Step T4

In order to program the data in the memory cell, the program voltage may be applied to the selected word line, and the pass voltage is applied to the non-selected word lines.

A programming rate of the data may be different according to the threshold voltage of the program target cells, and the program inhibition cells are not programmed.

Accordingly, the program operations of the memory cells may be simultaneously completed regardless of the program rate of the memory cells, and a time for the program operation may be decreased.

Figure 10:
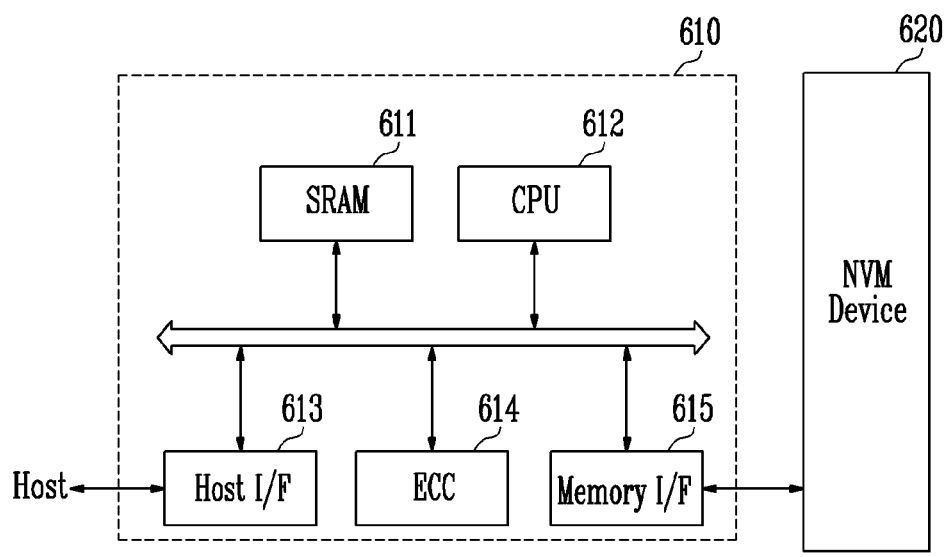
FIG. 10 is a block diagram schematically illustrating a memory system according to an embodiment of the present invention.

Referring to FIG. 10, a memory system 600 according to an embodiment of the present invention may include a non-volatile memory device 620 and a memory controller 610.

The non-volatile memory device 620 may include the aforementioned semiconductor memory device for compatibility with the memory controller 610, and may be operated by the aforementioned method. The memory controller 610 may be configured so as to control the non-volatile memory device 620. A memory card or a semiconductor disk device (Solid State Disk: SSD) may be provided through a combination of the non-volatile memory device 620 and the memory controller 610. An SRAM 611 is used as an operation memory of a central processing unit (CPU) 612. A host interface (Host I/F) 613 includes a data exchange protocol of a host connected with the memory system 600. An error correction block (ECC) 614 detects and corrects an error included in data read from the non-volatile memory device 620. A memory interface (Memory I/F) 614 interfaces with the non-volatile memory device 620 of the present invention. The central processing unit 612 performs a general control operation for data exchange of the memory controller 610.

Although it is not illustrated in the drawing, it is apparent to those skilled in the art that a ROM (not shown) for storing code data for interfacing with the host may be further included in the memory system 600 according to the present invention. The non-volatile memory device 620 may be provided as a multi-chip package including a plurality of flash memory chips. The aforementioned memory system 600 of the present invention may be provided as a storage medium with high reliability with low error generation probability. Especially, the flash memory device of the present invention may be included in a memory system, such as a semiconductor disk device (Solid State Disk (SSD)), which has been recently actively researched. In this case, the memory controller 610 may be configured so as to communicate with an external device (for example, a host) through one among various interface protocols, such as USB, MMC, PCI-E, SATA, PATA, SCSI, ESDI, and IDE.

Figure 11:
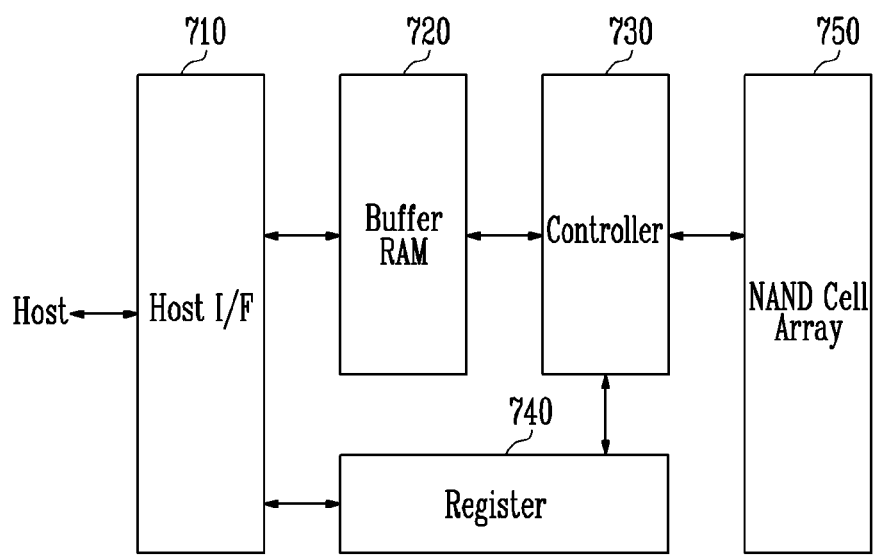
FIG. 11 is a block diagram schematically illustrating a fusion memory device or a fusion memory system for performing a program operation according to an embodiment.

Refer to FIG. 11. the One NAND flash memory device 700, for example, a fusion memory device may include a host interface (Host I/F) 710 for exchanging various information with a device using a different protocol, a buffer RAM 720 including a code for driving the memory device therein or temporarily storing data, a controller 730 for controlling a reading operation, a program operation, and all states in response to a control signal and a command provided from the outside, a register 740 for storing a command, an address, and data, such as configuration, for defining a system operation environment inside the memory device, and a NAND flash cell array 750 including an operation circuit including a non-volatile memory cell and a page buffer. The One NAND flash memory device 700 programs data in response to a write request from the host by a host.

Figure 12:
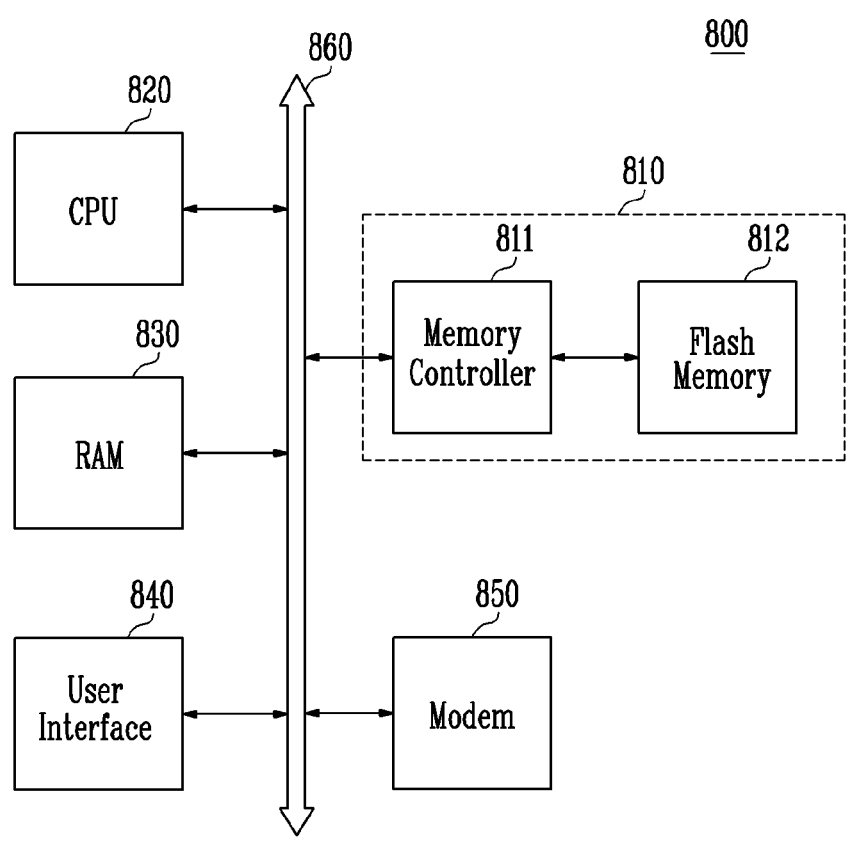
FIG. 12 is a block diagram schematically illustrating a computing system including a flash memory device according to an embodiment of the present invention.

Referring to FIG. 12. a computing system 800 according to the present invention may include a microprocessor (CPU) 820 electrically connected to a system bus 860, a RAM 830, a user interface 840, a modem 850, such as a baseband chipset, and a memory system 810. When the computing system 800 according to the present invention is a mobile device, a battery (not shown) for supplying an operation voltage of the computing system 800 may be additionally provided. Although it is not illustrated in the drawing, it is apparent to those skilled in the art that the computing system 800 according to the present invention may further include an application chipset, a Camera Image Processor (CIS), a mobile DRAM, and the like. The memory system 810 may include, for example, a Solid State Drive/Disk (SSD) using a non-volatile memory for storing data. Otherwise, the memory system 810 may be provided as a fusion flash memory (for example, a One NAND flash memory).

The embodiment of the present invention is not implemented only by the apparatus and the method, but may be implemented by a program performing a function corresponding to the configuration of the embodiment of the present invention or through a recording medium in which the program is recorded, and the implementation may be easily conceived from the description of the aforementioned embodiment by those skilled in the art.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
   a memory block including a plurality of memory strings including a source select transistors, first to n$^{th}$ memory cells, drain select transistors serially connected between bit lines and a source line, wherein the source select transistors are coupled to the source line, and the drain select transistors are coupled to the bit lines;
   string connection circuits coupled between the first memory cells and the source select transistors, wherein the string connection circuits in memory strings, in which program target cells are included, couple the first memory cells and the source select transistors to each other, and the string connection circuits in memory strings, in which the program target cells are not included, block the first memory cells and the source select transistors from each other; and
   a peripheral circuit configured to change a voltage level of a bit line connected to a program target cell according to a threshold voltage of the program target cell among the memory cells during a program operation,
   wherein the string connection circuit is configured to maintain a connection between the first memory cell and the source select transistor when the string includes the program target cell, and block the connection between the first memory cell and the source select transistor when the string includes a program inhibition cell, in response to a string control signal during the program operation, and
   wherein the string connection circuit is configured to control the connection between the first memory cell and the source select transistor according to the string control signal and inverse data which is inverted data programmed in the memory cell.

2. The semiconductor memory device of claim 1, wherein the string connection circuit includes:
   a first switching element configured to transmit the inverse data in response to the string control signal; and
   a second switching element configured to connect the first memory cell and the source select transistor in response to the transmitted inverse data.

3. The semiconductor memory device of claim 1, wherein the peripheral circuit includes:
   a page buffer configured to load the inverse data to the bit line; and
   a voltage supply circuit configured to apply a pass voltage to word lines in order to transmit the inverse data to the string connection circuit, to apply a read voltage to a selected word line among the word lines and apply the pass voltage to non-selected word lines in order to precharge channels of the strings, and to apply a source select voltage to a source select line in order to discharge the channel of the string including the program target cell among the strings.

4. The semiconductor memory device of claim 3, wherein the page buffer comprises:
   a latch unit connected to a sensing node and configured to store the data programmed in the memory cell and the inverse data; and
   a bit line connection circuit configured to connect the sensing node and the bit line in response to a bit line control signal,
   wherein the bit line connection circuit is configured to load the data to the bit line according to the data stored in the latch unit.

5. The semiconductor memory device of claim 4, wherein the bit line connection circuit further comprises:
   a third switching element configured to transmit a potential of the sensing node in response to the bit line control signal; and
   a fourth switching element configured to connect the sensing node and the bit line according to the potential of the transmitted sensing node.

6. A method of operating a semiconductor memory device, comprising;
   coupling a source line and source select lines in strings;
   coupling source select lines and first memory cells in first strings, among the strings, when program target cells are in the first strings, or blocking source select lines and first memory cell in second strings, among the strings, when the program target cells are not in the second strings;

loading inverse data obtained by inverting data to be stored in memory cells connected to the selected word line to bit lines;

maintaining or blocking the connection between the source line and the first memory cells according to the inverse data;

precharging the bit lines; and applying a program voltage to a selected word line coupled to the program target cell.

7. The method of claim 6, wherein in the connecting of the source line and the first memory cells, program inhibition data is loaded to the bit lines, and program data is blocked from being loaded to the bit lines.

8. A memory block, comprising:

a plurality of strings, wherein each string includes a source select transistor, first to $n^{th}$ memory cells, a drain select transistor serially connected between a source line and a bit line, and a string connection circuit connected between the first memory cell and the source select transistor, and the string connection circuit is configured to maintain the connection between the first memory cell and the source select transistor when the string includes a program target cell, and blocks the connection between the first memory cell and the source select transistor when the string includes a program inhibition cell, in response to a string control signal during the program operation, wherein the string connection circuit includes:

a first switching element configured to transmit inverse data which is inverted data programmed in the string in response to the string control signal; and a second switching element configured to connect the first memory cell and the source select transistor in response to the transmitted inverse data.

9. The memory block of claim 8, further comprising a peripheral circuit for control the memory block, wherein the peripheral circuit comprises:

a page buffer configured to load inverse data which is inverted data programmed in the string to the bit line; and a voltage supply circuit configured to apply a pass voltage to word lines in order to transmit the inverse data to the string connection circuit, to apply a read voltage to a selected word line among the word lines and apply the pass voltage to non-selected word lines in order to precharge channels of the strings, and to apply a source select voltage to a source select line in order to discharge the channel of the string including the program target cell among the strings.

10. The memory block of claim 8, wherein a voltage level of the bit line is adjusted by a threshold voltage of the program target cell, if the string includes the program target cell.

* * * * *